United States Patent [19]

Beckenbaugh et al.

[11] 4,261,800
[45] Apr. 14, 1981

[54] METHOD OF SELECTIVELY DEPOSITING A METAL ON A SURFACE OF A SUBSTRATE

[75] Inventors: William M. Beckenbaugh, East Amwell Township, Hunterdon County; Michael A. De Angelo, Ewing Township, Mercer County, both of N.J.

[73] Assignee: Western Electric Co., Inc., New York, N.Y.

[21] Appl. No.: 824,932

[22] Filed: Aug. 15, 1977

[51] Int. Cl.³ ............................................. C25D 5/02
[52] U.S. Cl. ................................... 204/15; 204/38 B; 427/54.1; 427/98; 427/306; 427/333; 427/443.1
[58] Field of Search ......................... 427/54, 304–306, 427/54.1, 98, 306, 333, 443.1; 204/15

[56] References Cited

U.S. PATENT DOCUMENTS

| | | | |
|---|---|---|---|
| 3,791,340 | 2/1974 | Ferrara | 427/54 |
| 4,078,096 | 3/1978 | Redmond et al. | 427/304 |

Primary Examiner—Bernard D. Pianalto
Attorney, Agent, or Firm—J. F. Spivak

[57] ABSTRACT

A method of selectively depositing a metal on a surface of a substrate is disclosed. A suitable substrate is selected and a surface is treated with a reducing agent selected from the group consisting of (a) hydrazine, (b) a substituted hydrazine having the structural formula

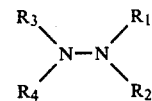

where $R_1$ is an organic radical selected from the group consisting of alkyl, cycloalkyl, aryl, alkaryl, aralkyl, alkoxy, aryloxy and heterocyclic radicals and $R_2$, $R_3$ and $R_4$ are the hydrogen radical or are the same as $R_1$, and (c) a mixture of the foregoing. The reducing agent treated surface is selectively exposed to a source of ultraviolet radiation to render a selected area thereof incapable of reducing an activating metal species and to delineate an unexposed area so capable. The selectively radiation-exposed surface is treated with an activating metal species to activate the delineated, unexposed area.

15 Claims, 3 Drawing Figures

METHOD OF SELECTIVELY DEPOSITING A METAL ON A SURFACE OF A SUBSTRATE

BACKGROUND OF THE INVENTION

1. Field of the Invention

This invention relates to a method of selectively depositing a metal on a surface of a substrate and more particularly, to depositing a metal pattern on a nonconductive substrate utilizing a method comprising a selective exposure to a source of ultraviolet radiation.

2. Description of the Prior Art

There is a growing need in various device and circuit applications for an inexpensive process which will produce adherent conducting circuit patterns on a nonconductive surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals.

An electroless metal deposition process is especially attractive for metallic pattern generation since one only needs to produce a pattern of a suitable catalyst on a substrate and metal deposition will occur only on that pattern. Generally speaking, a conventional electroless plating process includes sensitizing an electrically non-conducting surface with a sensitizer, e.g., a stannous chloride solution. The surface is then immersed in an activating solution, comprising an activating metal salt, e.g., a noble metal salt, wherein an activating metal is reduced on the surface. The activating metal-reduced surface is then subjected to an electroless metal deposition bath, which is catalyzed by the reduced activating metal, and wherein an electroless metal deposit is obtained.

A refinement of the conventional electroless plating process is necessary when the electrolessly plated metal is electrolessly deposited onto selected portions of a substrate surface in a pattern rather than on the entire surface, to produce a printed circuit board. One such process is disclosed in U.S. patent application Ser. No. 814,564, filed by M. A DeAngelo on July 11, 1977 and now U.S. Pat. No. 4,096,843, and entitled "A Method of Selectively Deposition a Metal on a Surface of a Substrate," and assigned to the assignee hereof, wherein a hydrazine and/or substituted hydrazine-treated surface is selectively exposed to a source of ultraviolet radiation to delineate an ultraviolet radiation-exposed pattern no longer capable of desensitizing an electroless metal deposition sensitizer, such as $Sn^{+2}$ ions. The ultraviolet radiation exposed surface is then treated with a sensitizer, followed by treatment with an activator to form a catalytic activating metal pattern which can be electrolessly metal deposited.

SUMMARY OF THE INVENTION

This invention relates to a method of selectively depositing a metal on a surface of a substrate, and more particularly, to depositing a metal pattern on a non-conductive substrate utilizing a method comprising a selective exposure to a source of ultraviolet radiation.

A surface of a substrate is treated with a reducing agent selected from the group consisting of (a) hydrazine, (b) a substituted hydrazine having the structural formula

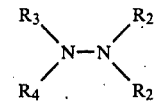

where $R_1$ is an organic radical selected from the group consisting of alkyl, cycloalkyl, aryl, alkaryl, aralkyl, alkoxy, aryloxy and heterocyclic radicals and $R_2$, $R_3$, and $R_4$ are the hydrogen radical or are the same as $R_1$, and (c) a mixture of the foregoing reducing agents. The reducing agent treated surface is selectively exposed to a source of ultraviolet radiation to render a selected exposed area thereof incapable of reducing an activating metal species and to delineate an unexposed area so capable. The selectively radiation exposed surface is treated with an activating metal species to activate the delineated unexposed area.

BRIEF DESCRIPTION OF THE DRAWINGS

The present invention will be more readily understood by reference to the following drawing taken in conjunction with the detailed description, wherein.

DETAILED DESCRIPTION

The present invention has been described primarily in terms of depositing copper on a surface of an insulative substrate. It will be readily appreciated that the inventive concept is equally applicable to depositing other suitable metals, which are catalytically reduced from their respective ions in an electroless metal deposition bath by catalytic activating or noble metals.

Figure 1:
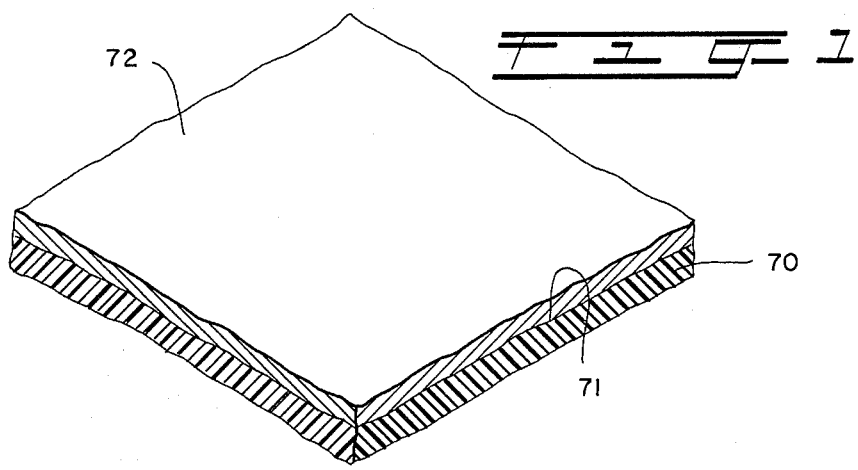
FIG. 1 is a partial isometric view of a non-conductive substrate having a reducing agent layer.

Referring to FIG. 1, there is shown a portion of a suitable substrate 70. For the production of electrical circuit patterns, suitable substrates are those which are generally electrically non-conductive. In general, all dielectric materials are suitable substrates. A particularly suitable substrate comprises a polyimide. A suitable polyimide includes any polyimide of a polyamide-acid having the formula

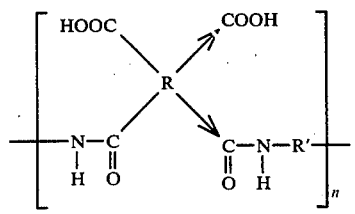

where the arrows denote isomerism, R is an organic tetravalent radical containing at least two carbon atoms, no more than 2 carbonyl groups of each polyamide-acid unit being attached to any one carbon atom of said tetravalent radical; R' is a divalent radical containing at least two carbon atoms, the amide groups of adjacent polyamide-acid units each attached to separate carbon atoms of said divalent radical; and n is a positive integer sufficient to provide the polyamide acid with an inherent viscosity of at least 0.1. Typical of such a polyimide is E. I Dupont de Nemours' "Kapton." "Kapton" is a polyimide formed from pyromellitic dianhydride

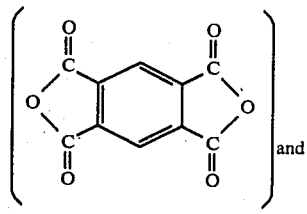

4,4'-diamino-diphenyl ether

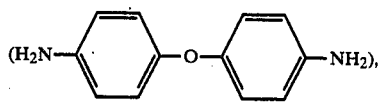

and which has a general formula

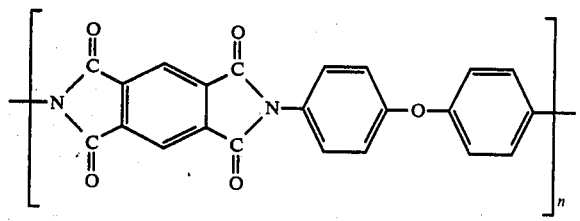

where n is an integer ranging from 150 to 650, and which has an average molecular weight ranging from 60,000 to 250,000. The above polyimdies and their preparation are fully described in Edwards, U.S. Pat. No. 3,179,614, incorporated by reference hereinto. A surface 71 of substrate 70 is treated, e.g., by immersion, spraying, etc., with a solution comprising a suitable reducing agent, e.g., a 5 to 8 weight percent aqueous hydrazine solution, to form a reducing agent layer or film 72 (greatly enlarged for illustrative purposes only). The reducing agent from the reducing agent solution is either adsorbed (deposited) onto surface 71 or absorbed into surface 71 to form layer 72. The amount of reducing agent comprising layer 72 should be sufficient to reduce an activating metal species, such as for example $Pt^{+2}$, $Pd^{+2}$ ions, etc., which comes in contact therewith. The concentration of the reducing agent in layer 72 is easily ascertained experimentally by one skilled in the art in view of the disclosure contained herein. Typically, for a 5 to 85 weight percent aqueous hydrazine solution, surface 71, e.g., a polyimide surface, is treated therewith for 1 to 5 minutes at 25° C. whereby an adequate reducing agent layer 72 is obtained.

Suitable reducing agents include (a) hydrazine, (b) a substituted hydrazine having the structural formula

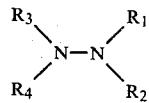

where $R_1$ is an organic radical selected from the group consisting of alkyl, cycloalkyl, aryl, alkaryl, aralkyl, alkoxy, aryloxy, and heterocylic radicals and $R_2$, $R_3$ and $R_4$ are the hydrogen radical, H, or are the same as $R_1$, and (c) mixtures of the foregoing reducing agents.

The reducing agent may be emplyed in a wide variety of ways to form reducing agent layer 72. For example the reducing agent may be combined or dissolved in an appropriate solvent and surface 71 exposed thereto by immersion, brushing, spraying, etc. Any solvent which is chemically compatible with the reducing agent and the substrate 70 may be used. Besides water, organic solvents such as saturated and unsaturated alkyl hydrocarbons, as well as aryl, alkyl aryl and aryl/alkyl hydrocarbons may be used. Halogenated forms of such hydrocarbons are also suitable. Polar organic solvents such as aldehydes, ketones, or alcohols may also be used. The reducing agent treated surface 71 may then be water rinsed and then dried if necessary to form layer 72. It is to be noted that reducing agent treated surface 71 should not be water rinsed over an extended period of time since the reducing agent species, e.g., hydrazine, will decompose and become ineffective. Typically the reducing agent treated surface is water rinsed for about one minute at 25° C.

A suitable activating metal species is one which is subsequently converted into a catalytic metal, as by reduction with the suitable reducing agent, e.g., $H_2N$-$NH_2$, the catalytic metal functioning to catalyze a reduction of an electroless metal from an electroless metal deposition solution. Some suitable activating metal species include a salt of a noble metal selected from Au, Ag, Ir, Pt, Pd, Rh, Os and Ru. Typical salts include the halides, e.g., chlorides, bromides, etc., nitrates, hydroxides of these activating metals. The activating metal salts are usually formed or dissolved in an aqueous medium. However, any compatible liquid vehicle may be employed and activation with the activating metal species is not restricted to an aqueous system alone. Other metal species are well known in the art of electroless metal deposition.

Figure 2:
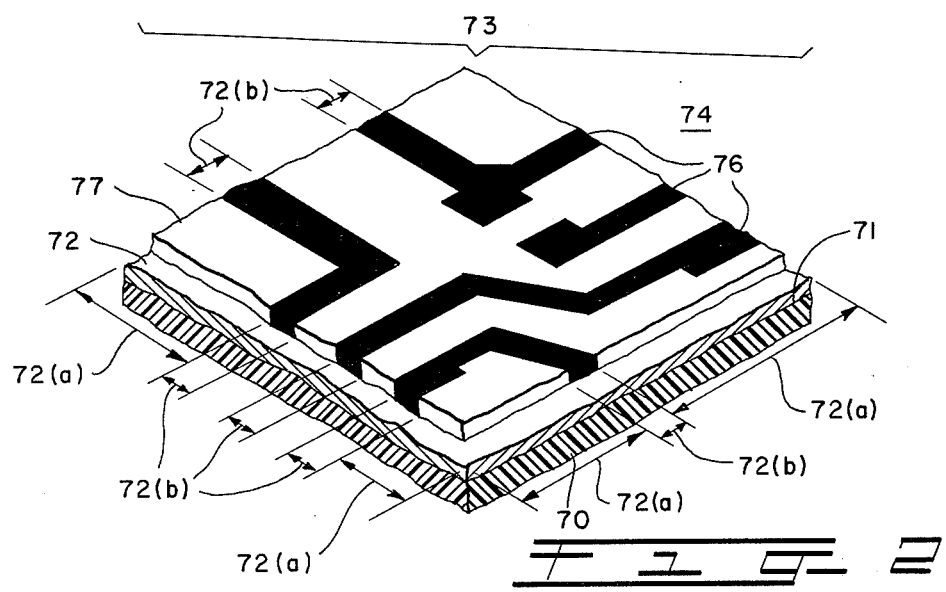
FIG. 2 is a partial isometric view of the substrate of FIG. 1 being selectively exposed to a source of ultraviolet radiation through a suitable mask.

Referring to FIG. 2, a suitable mask 74 is placed adjcent to reducing agent layer 72. Mask 74 is a positive mask, i.e., has opaque areas 76 which are incapable of transmitting therethrough a desired radiation to which positive mask 74 and ultimately, reducing agent layer 72 is destined to be exposed, which areas correspond to a desired electroless metal deposited pattern. Positive mask 74 has areas 77 which are capable of transmitting therethrough the desired radiation to which positive mask 74 and reducing agent layer 72 are destined to be exposed. It should be noted that in the alternative, spearate masking layers may be applied to layer 72, utilizing standard materials and techniques known in the art.

A suitable radiation source 73 is selected. A suitable radiation source typically includes an ultraviolet radiation source having a wavelength in the range of 1800 A. to 2900 A. The radiation source 73, e.g., an ultraviolet radiation source having a wavelength ranging from 1800 A. to 2900 A., is placed above mask 74 and directed thereat, either in an oxidizing or non-oxidizing ambient. A plurality of rays having a wavelength ranging from 1800 A. to 2900 A. passes through or is transmitted through areas 77 of mask 74 to expose areas 72(a) of reducing agent layer 72 thereto. The thus exposed areas 72(a) of the reducing agent species containing layer 72, underlying and corresponding to areas 77 of positive mask 74, are thereby rendered incapable of reducing an activating metal species to which substrate 70 is destined to be exposed. The remaining radiation unexposed areas 72(b) of layer 72 are still capable of reducing an activating metal species.

A reducing agent species containing pattern or outline [comprising areas 72(b)], delineated by ultraviolet radiation exposure, which is capable of reducing an activating metal species and thus is capable of participating in an electroless metal deposition process is thus established.

It is to be noted at this point that layer 72 contained on surface 71 is exposed to ultraviolet radiation source 73 for a period of time sufficient to render areas 72(a) incapable of reducing an activating metal species. Such a period of time is readily ascertained experimentally by one skilled in the art for a particular ultraviolet radiation source. It is to be noted, however, that the time of exposure is interdependent upon the intensity of source 73, i.e., upon the energy transmitted by source 73 to layer 72. This interdependency is well known in the art or is easily ascertained experimentally by one skilled therein. The amount of energy supplied to reducing agent layer 72 by source 73, however, is not found to be critical and a typical exposure may range from 1 to 5 minutes at an intensity ranging from about 100 to about 500 micro-watts/cm$^2$ at wavelengths ranging from 1800 A. to 2900 A. for a reducing agent layer 72 formed by treatment of a polyimide surface 71 for 5 minutes at 25° C. with a 50 to 85 weight percent aqueous hydrazine solution.

The resultant radiation-exposed substrate 70 is treated, e.g., as by immersion, spraying, etc., with an activating metal species containing solution, to activate radiation unexposed areas 72(b) of layer 72. Activation is a conventional process in the electroless deposition art and comprises depositing or absorbing on the surface of areas 72(b) a deposit of catalytic metal, e.g., noble metals, such as Pd, Pt, Ag, Au, Ir, Os, Rh, Rd, in sufficient quantities to successfully catalyze a plating reaction once the activated surface of areas 72(b) is introduced into an electroless metal deposition solution. The activators and procedures of activation are well known and may be found, in part, in *Metallic Coating of Plastics*, William Goldie, Electrochemical Publications, 1968.

Remaining areas 72(a) of layer 72 which were exposed to the radiation are not activated due to the fact that the species contained thereon or therein does not function to reduce the activating metal specieds, e.g., $Pd^{+2}$, $Pt^{+2}$, $Ag^{+1}$, $Au^{+1}$, etc., to which it is exposed. The activating metal species, e.g., $Pd^{+2}$, $Pt+2$, deposited on radiation exposed areas 72(a) are thus unable to participate in an electroless metal deposition, as by functioning as a catalytic noble metal.

Figure 3:
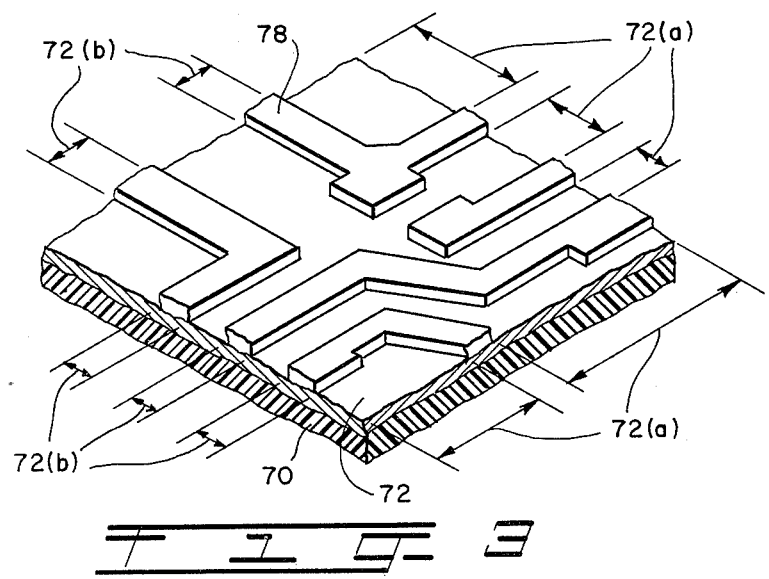
FIG. 3 is a partial isometric view of the substrate of FIG. 1 having thereon an electroless metal-deposited pattern.

Referring to FIG. 3, after activation, activated substrate 70 may be rinsed with water, typically for 1 to 2 minutes at 25° C., whereafter it is immersed in a suitable electroless metal deposition solution wherein an electroless metal ion, e.g., $Cu^{+2}$, is reduced to the metal, e.g., $Cu°$, and deposited on areas 72(b) of the substrate 70 to form an electroless metal deposit 78. A suitble electroless metal deposition solution comprises a metal ion, e.g., $Cu^{+2}$, which is catalytically reduced to its corresponding metal, e.g., $Cu°$, by a suitable reducing agent, e.g.,

in the presence of a catalytic species, e.g., an activating metal such as Pd.

After a suitable electroless deposit is obtained, typically 3 to 10 micro-inches in thickness, electroless metal deposit 78 may then be further built up by prolonged immersion in the electroless metal deposition solution or alternatively by being electroplated in a standard electroplating bath. It is to be noted that the various typical electroless and electroplating solutions, plating conditions and procedures are well knwon in the art and will not be elaborated herein. Reference in this regard is again made to *Metallic Coating of Plastics*, William Goldie, previously referred to. It is to be noted that the invention disclosed herein may be employed in the production of electrical circuit patterns on a non-conductive substrate, in a similar fashion to that revealed in U.S. Pat. No. RE. 29,015 assigned to the assignee hereof and incorporated by reference herein. In this regard, referring back to FIG. 2, areas 72(b) of layer 72 constitute a portion of a pattern conforming to a desired electrical circuit pattern. Referring to FIG. 3, electroless deposit 78 obtained constitutes a portion of the electrical circuit pattern. The resulting electrical circuit pattern, partially represented by deposit 78 (FIG. 3) may be electroplated to a desired thickness to obtain the desired circuit pattern.

EXAMPLE

A polyimide substrate, comprising "Kapton," which is a polyimide made from the anhydride of pyromellitic acid and 4,4diamino-diphenyl ether, and is represented as having a general formula

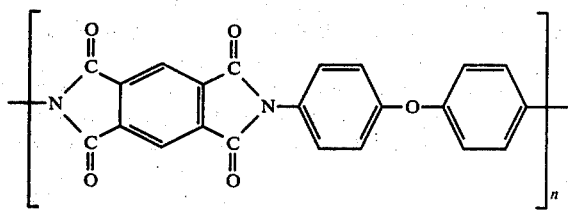

where n is an integer ranging from 150 to 650, and which has an average molecular weight ranging from 60,000 to 250,000, was treated with a 64 weight percent aqueous hydrazine solution for 5 minutes at 25° C. to form a reducing agent layer. The treated substrate was rinsed for one minute with deionized water, dried with a nitrogen gas stream at 25° C. for 30 seconds and then selectively exposed to ultraviolet radiation with a 900 watt xenon lamp for 2 minutes at a distance of one foot whereby a selected radiation-exposed portion of the surface was renderd incapable of reducing an activating metal species. The remaining unexposed portions were so capable. The selective radiation exposed substrate was rinsed for one minute in deionized water at 25° C. and then activated (on the radiation unexposed portions only) by immersion in an aqueous solution comprising 0.05 weight perent $PdCl_2$ with 0.1 weight percent HCl. The activated substrate was rinsed with deionized water and then immersed in an electroless copper deposition solution, commercially obtained, comprising cupric sulfate, formaldehyde, complexer and caustic, wherein an electroless copper metal deposit covering only the radiation unexposed portions of the surface was obtained. the electroless deposit had a thickness of about 5 micro-inches.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of selectively depositing a metal on a surface of a substrate which comprises:
   (a) treating the surface with a reducing agent comprising hydrazine;
   (b) selectively exposing said treated surface to a source of ultraviolet radiation to render a selected area thereof incapable of reducing an activating metal species and to delineate a radiation unexposed area capable of reducing an activating metal species; and
   (c) treating said selectively radiation exposed surface with an activating metal species to selectively activate said delineated, unexposed area.

2. The method as defined in claim 1 which further comprises:
   exposing at least said activated area to an electroless metal deposition solution to deposit an electroless metal on said activated area.

3. The method as defined in claim 2 which further comprises electroplating said electroless metal deposit.

4. The method as defined in claim 1 wherein said activating species comprises a species of a metal selected from the group consisting of Au, Ag, Pd, Pt and a mixture of any of the foregoing metals.

5. The method as defined in claim 4 wherein said species comprises a $Pd^{+2}$ species.

6. The method as defined in claim 1 wherein said substrate surface comprises a polyimide.

7. A method of forming an activated pattern on a surface of a substrate, the pattern being usable to catalyze and reduce thereon an electroless metal deposit from an electroless metal deposition solution, which comprises:
   (a) treating the surface with a reducing agent comprising hydrazine;
   (b) exposing a selected portion of said treated surface to a source of ultraviolet radiation to delineate an unexposed pattern corresponding to the activated pattern; and
   (c) treating said ultraviolet radiation-exposed surface with an activator to selectively activate said unexposed pattern.

8. The method as defined in claim 7 wherein saidactivator comprises a species of a metal selected from the group consisting of Au, Ad, Pd, Pt and a mixture of any of the foregoing metals.

9. The method as defined in claim 8 wherein said species comprises a $Pd^{+2}$ species.

10. The method as defined in claim 7 wherein said surface comprises a polyimide.

11. A method of producing an electrical circuit pattern on a non-conductive substrate, which comprises:
    (a) treating a surface of the substrate with a reducing agent comprising hydrazine;
    (b) selectively exposing said treated surface to a source of ultraviolet radiation to form a radiation unexposed surface pattern corresponding to the electrical circuit pattern; and
    (c) treating said selectively radiation exposed surface with an activator to selectively activate said unexposed pattern.

12. The method as defined in claim 11 which further comprises:
    treating said activated pattern with an electroless metal deposition solution to deposit an electroless metal deposit thereon.

13. The method as defined in claim 12 wherein:
    said activator is selected from the group consisting of a palladium species, a platinum species, a gold species, a silver species and a mixture of any of the foregoing species.

14. The method as defined in claim 13 wherein said activator comprises a $Pd^{+2}$ species.

15. The method as defined in claim 11 wherein said surface comprises a polyimide.

* * * * *